United States Patent
Kuo

(10) Patent No.: US 9,006,775 B1
(45) Date of Patent: Apr. 14, 2015

(54) LIGHT-EMITTING DIODE

(71) Applicant: Lextar Electronics Corporation, Hsinchu (TW)

(72) Inventor: Shiou-Yi Kuo, Kaohsiung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/337,446

(22) Filed: Jul. 22, 2014

(30) Foreign Application Priority Data

Oct. 23, 2013 (TW) .............................. 102138197 A

(51) Int. Cl.
*H01L 33/00* (2010.01)
*H01L 33/60* (2010.01)
*H01L 33/32* (2010.01)

(52) U.S. Cl.
CPC ................ *H01L 33/60* (2013.01); *H01L 33/32* (2013.01)

(58) Field of Classification Search
CPC ................................ H01L 33/60; H01L 33/32
USPC ............................................. 257/98, 99, 100
See application file for complete search history.

(56) References Cited

U.S. PATENT DOCUMENTS

| | | | |
|---|---|---|---|
| 2002/0134987 A1* | 9/2002 | Takaoka ........................... | 257/98 |
| 2011/0068359 A1* | 3/2011 | Yahata et al. .................... | 257/98 |
| 2012/0049234 A1* | 3/2012 | Cheng .............................. | 257/99 |
| 2013/0105845 A1* | 5/2013 | Kim et al. ........................ | 257/98 |
| 2013/0270418 A1* | 10/2013 | Cho et al. ................... | 250/206.1 |
| 2013/0292719 A1* | 11/2013 | Lee et al. ......................... | 257/93 |

* cited by examiner

*Primary Examiner* — Bilkis Jahan

(57) ABSTRACT

A light-emitting diode (LED), including a first semiconductor layer defining several light-emitting regions and non-light-emitting regions; an active layer and a second semiconductor layer sequentially formed over the first semiconductor layer in the light-emitting regions; a transparent conductive layer formed over the second semiconductor layer; a Bragg reflector structure formed over the transparent conductive layer and including several first via holes; a metal layer formed over the Bragg reflector structure and connected to the transparent conductive layer through the first via holes; a passivation layer covering the metal layer and including several second via holes; several third via holes exposing the first semiconductor layer in the non-light-emitting regions; several first electrodes filling the third via holes and connected to the first semiconductor layer; and several second electrodes filling the second via holes and connected to the metal layer.

15 Claims, 5 Drawing Sheets

LIGHT-EMITTING DIODE

CROSS REFERENCE TO RELATED APPLICATIONS

The present application claims priority of Taiwan Patent Application No. 102138197, filed on Oct. 23, 2013, the entirety of which is incorporated by reference herein.

BACKGROUND OF THE INVENTION

1. Field of the Invention

The present application relates to a light-emitting diode (LED), and in particular to a flip-chip type LED.

2. Description of the Related Art

A light-emitting diode (LED) is usually fabricated by forming an active layer over a substrate and depositing various conductive and semi-conductive layers over the substrate. The recombination of electron and hole can produce electromagnetic radiation (such as light) through the current at the p-n junction.

In recent years, a flip-chip type LED has gradually replaced the traditional LED. In the flip-chip packaging, electrodes and substrate of the flip-chip LED can be directly connected, thus preventing the illumination of the LED from being affected by the electrodes, and reducing the thermal resistance therebetween. Accordingly, the illumination efficiency thereof can be improved.

FIG. 1 is a sectional view of a conventional flip-chip type LED. As shown in FIG. 1, the conventional flip-chip type LED 10 comprises a substrate 10a, a first semiconductor layer 10b, an active layer 10c, a second semiconductor layer 10d, a reflecting ohmic contact layer 10e, a buffer layer 10f, a passivation layer 10g, a first electrode 10h, and a second electrode 10i. It should be understood that the reflecting ohmic contact layer 10e, such as a Ni/Ag/Pt alloy or Ni/Al/Ti alloy layer capable of conduction and light reflection, is very difficult to fabricate. Therefore, an LED which can be easily and effectively fabricated and has high illumination efficiency is needed.

BRIEF SUMMARY OF THE INVENTION

The present disclosure provides a light-emitting diode (LED), including a first semiconductor layer defining a plurality of light-emitting regions and non-light-emitting regions; an active layer and a second semiconductor layer sequentially formed over the first semiconductor layer in the light-emitting regions, wherein a plurality of light-emitting diode (LED) stack structures are formed by the first semiconductor layer in the light-emitting regions, the active layer, and the second semiconductor layer; a transparent conductive layer formed over the second semiconductor layer of the LED stack structures; a Bragg reflector structure, also known as Distributed Bragg Reflector (DBR), formed over the transparent conductive layer and including a plurality of first via holes exposing the transparent conductive layer over the LED stack structures; a metal layer formed over the Bragg reflector structure and filling the first via holes, wherein the metal layer is connected to the transparent conductive layer over the LED stack structures through the first via holes; a passivation layer covering the metal layer and including a plurality of second via holes exposing the metal layer; a plurality of third via holes exposing the first semiconductor layer in the non-light-emitting regions; a plurality of first electrodes filling the third via holes and connected to the first semiconductor layer; and a plurality of second electrodes filling the second via holes and connected to the metal layer.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
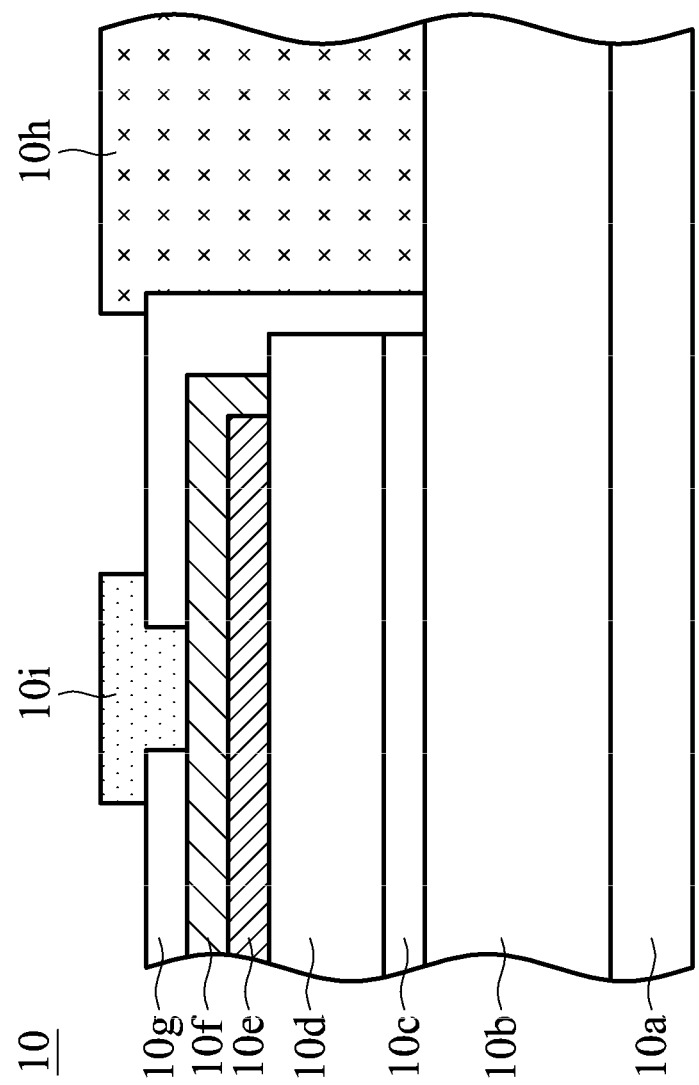
FIG. 1 is a sectional view of a conventional flip-chip type LED.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. It is also noted that in the accompanying drawings, like and/or corresponding elements are denoted by like reference numerals.

In this specification, expressions such as "over the substrate", "above the layer", or "on the film" simply denote a relative positional relationship with respect to the surface of a base layer, regardless of the existence of intermediate layers. Accordingly, these expressions may indicate not only the direct contact of layers, but also, a non-contact state of one or more laminated layers.

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted by an idealized or overly formal manner unless defined otherwise.

Figure 2A:
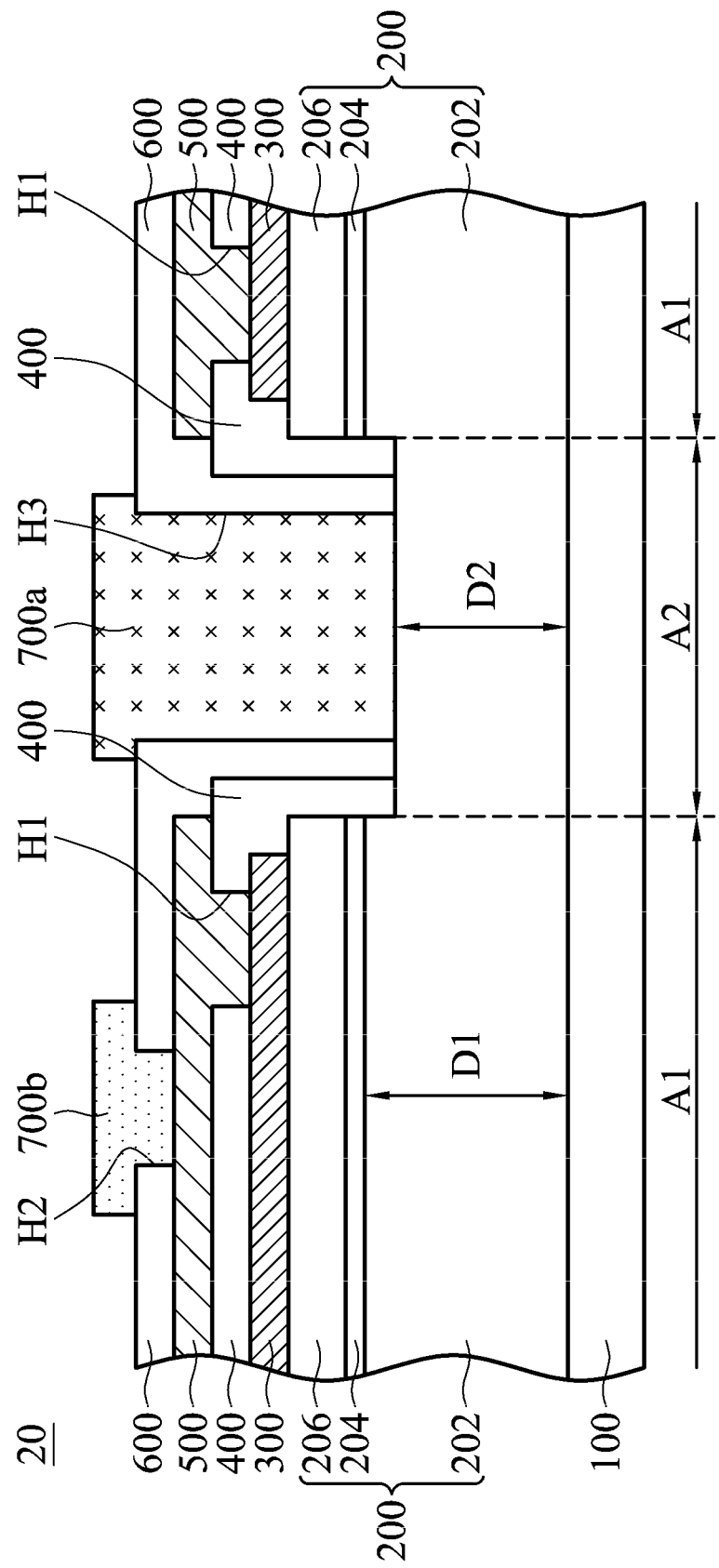
FIG. 2A is a sectional view of an LED according to an embodiment of the invention.

Referring to FIG. 2A, a light-emitting diode (LED) 20 according to an embodiment of the invention, such as a flip-chip type LED, includes a substrate 100 with a first semiconductor layer 20 formed thereon. The first semiconductor layer 20 defines a plurality of predetermined light-emitting regions A1 and non-light-emitting regions A2 (FIG. 2A only shows two light-emitting regions A1 and a non-light-emitting region A2 for illustration), wherein the height D1 of the light-emitting regions A1 exceeds the height D2 of the non-light-emitting regions A2. In addition, an active layer 204 and a second semiconductor layer 206 are sequentially formed over the first semiconductor layer 20 in the first light-emitting regions A1, such that a plurality of light-emitting diode (LED) stack structures 200 are formed by the first semiconductor layer 202 in the light-emitting regions A1, the active layer 204, and the second semiconductor layer 206 (as the two LED stack structures 200 on both sides of the element 700a show in FIG. 2A).

In this embodiment, the substrate 100 is a transparent sapphire substrate, the first semiconductor layer 202 is a N-type III-V semiconductor layer, and the second semiconductor layer 206 is a P-type III-V semiconductor layer. The III-V semiconductor layer, for example, is a nitride comprising Ga, such as GaN, InGaN, or AlInGaN. The active layer 204 includes, but is not limited to, homojunction, heterojunction, single-quantum well (SQW), multiple-quantum well (MQW), or any other suitable structures.

Keep referring to FIG. 2A, the LED 20 further includes a transparent conductive layer 300 formed over the second semiconductor layer 206 in each of the LED stack structures 200. In this embodiment, the transparent conductive layer 300 comprises indium-tin oxide (ITO) which has the advantages of high electrical conductivity and excellent adhesion to a base layer. As such, the surface resistance of the second semiconductor layer 206 is reduced, and the driving voltage of the LED 20 is decreased accordingly. Meanwhile, fabrication of the transparent conductive layer 300 can also be easier. In some embodiments, the transparent conductive layer 300 comprises indium-zinc oxide (IZO) or Al-doped zinc oxide (AZO).

A Bragg reflector structure 400, also known as Distributed Bragg Reflector (DBR), is formed over the transparent conductive layer 300. The Bragg reflector structure 400 comprises multiple alternatively stacked films with two different refractive indices, and the films are made of homogeneous or heterogeneous materials. Specifically, the light emitted from the active layer 204 in the LED stack structures 200 can be reflected by the Bragg reflector structure 400 toward the substrate 100 and emitted out of the LED 20, such that the illumination efficiency of the LED 20 can be increased. As shown in FIG. 2A, the Bragg reflector structure 400 also covers the side-wall of the LED stack structures 200.

Moreover, the Bragg reflector structure 400 further includes a plurality of first via holes H1 for exposing the transparent conductive layer 300 over each of the LED stack structures 200. The LED 20 further includes a metal layer 500 over the Bragg reflector structure 400 and filling the first via holes H1. Accordingly, the metal layer 500 can be connected to the transparent conductive layer 300 over each of the LED stack structures 200 through the first via holes H1. In some embodiments, the metal layer 500 comprises Ag, Al, Rh, or a combination thereof.

Still referring to FIG. 2A, the LED 20 further includes a passivation layer 600 covering the metal layer 500 and the Bragg reflector structure 400 which covers the side-wall of the LED stack structures 200, thus the electric leakage due to the current conduction at the junction between the first and second semiconductor layers 202 and 206 can be effectively prevented. Moreover, the passivation layer 600 includes a plurality of second via holes H2 (FIG. 2A only shows a second via hole H2 for illustration) for exposing the metal layer 500 over each of the LED stack structures 200.

The LED 20 further includes a plurality of third via holes H3, first electrodes 700a, and second electrodes 700b (FIG. 2A only shows a third via hole H3, a first electrode 700a, and a second electrode 700b for illustration). The third via holes H3 are formed on the first semiconductor layer 202 in the non-light-emitting regions A2. Specifically, the first electrodes 700a fully fill the third via holes H3 and are connected to the first semiconductor layer 202 through the third via holes H3. The second electrodes 700b fully fill the second via holes H2 and are connected to the metal layer 500 through the second via holes H2. Accordingly, the current loaded into the first electrodes 700a can directly flow to the first semiconductor layer 202, and the current loaded into the second electrodes 700b can flow to the second semiconductor layer 206 through the metal layer 500 and the transparent conductive layer 300.

Figure 2B:
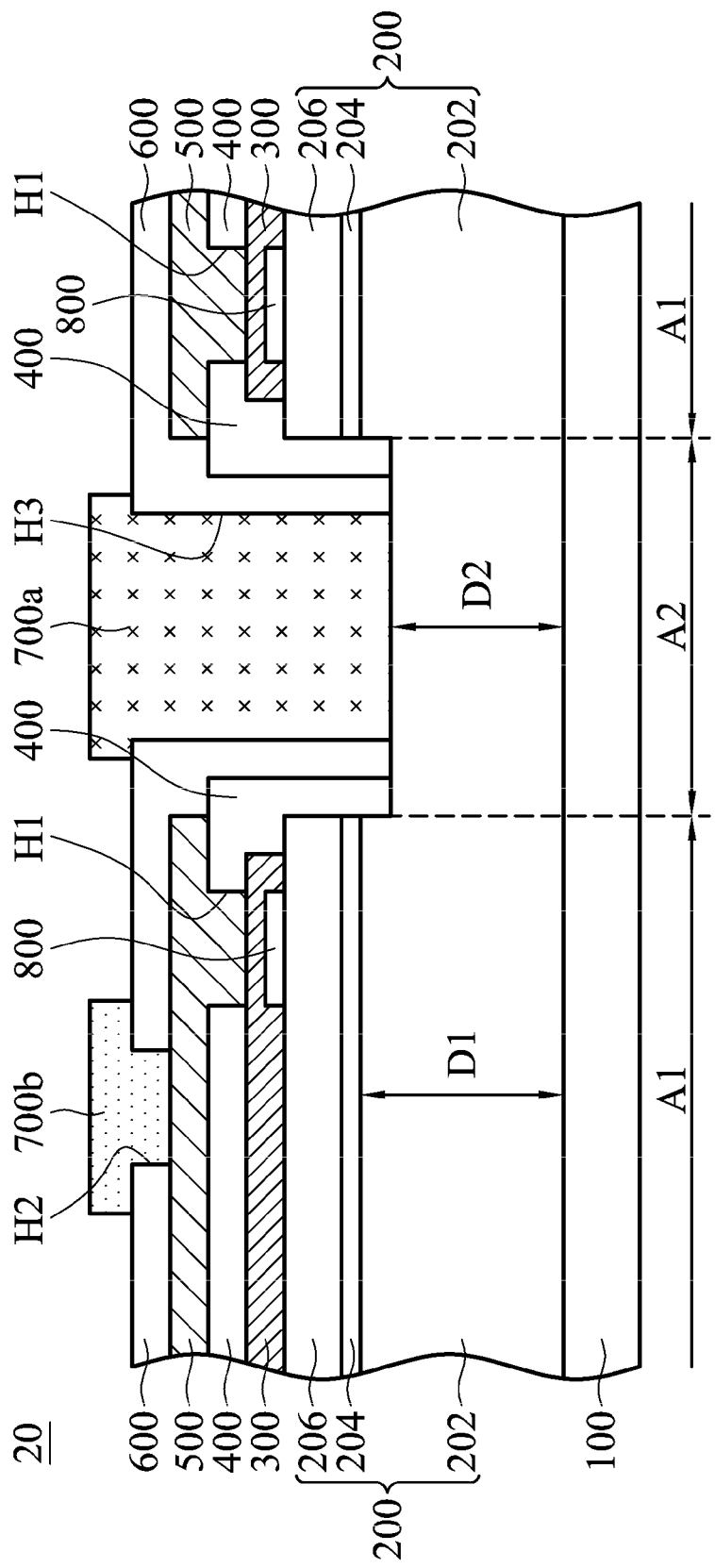
FIG. 2B is a sectional view of an LED according to another embodiment of the invention.

FIG. 2B is a sectional view of an LED 20 according to another embodiment of the invention. Compared with the LED 20 in FIG. 2A, the LED 20 in FIG. 2B further includes a current blocking layer 800 formed between the transparent conductive layer 300 and the second semiconductor layer 206 in each of the LED stack structures 200. Specifically, the current blocking layer 800 is underneath the first via holes H1, such that the current flowing to the second semiconductor layer 206 can be averagely distributed.

It should be further emphasized that the transparent conductive layer 300 has an attribute whereby the current easily flows through the junction to the adjacent layer rather than flows within the transparent conductive layer 300. Therefore, a main function of the metal layer 500 is to conduct the current flowing to the transparent conductive layer 300 and to improve the uniformity of current distribution to the second semiconductor layer 206, thereby enhancing the illumination efficiency of the LED.

Figure 3A:
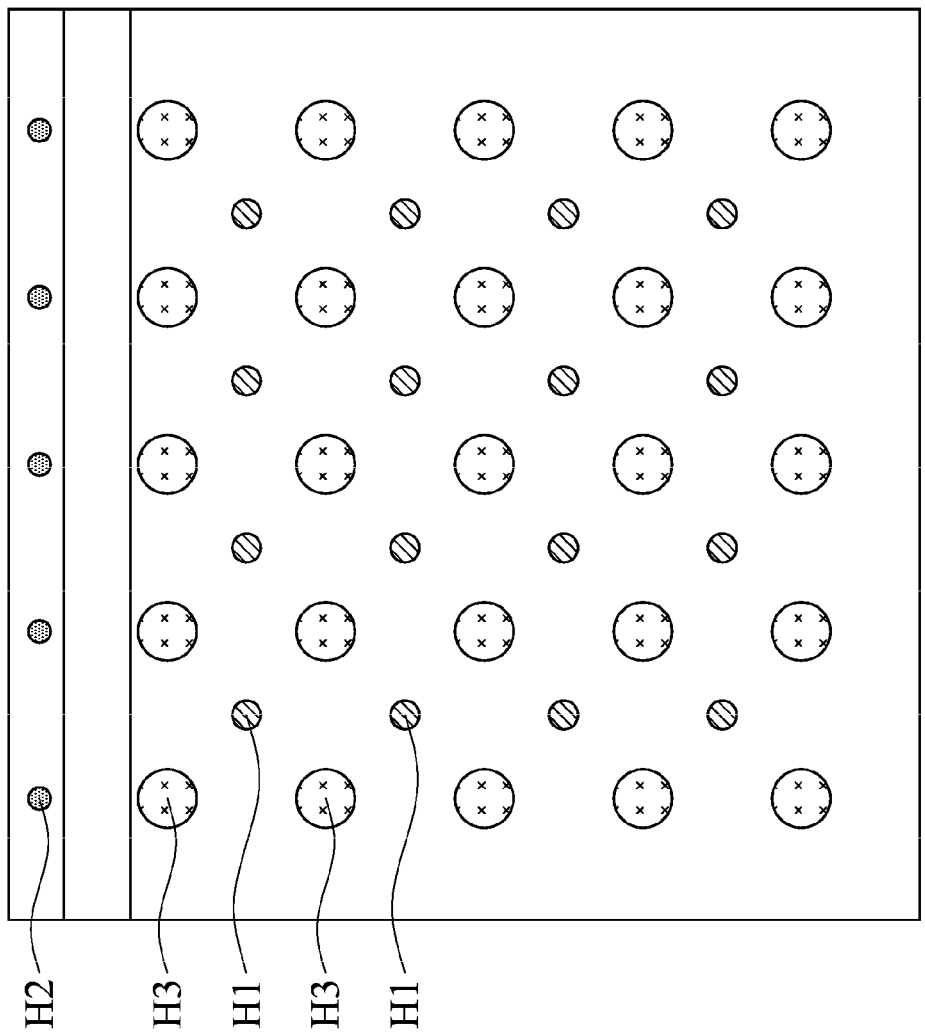
FIG. 3A is a schematic diagram shows the electrical contact configuration of an LED according to an embodiment of the invention.

Referring to FIG. 3A (top view), an LED 20 according to an embodiment of the invention includes a plurality of first via holes H1, second via holes H2, and third via holes H3. The second via holes H2 are disposed on a side of the LED 20. The first via holes H1 and the third via holes H3 are arranged in matrices, and each of the first via holes H1 is surrounded by four of the third via holes H3. Accordingly, the second electrodes 700b can be connected to the metal layer 500 through the second via holes H2, and the metal layer 500 can be connected to several positions on the transparent conductive layer 300 through the first via holes H1, thus improving the uniformity of current distribution to the second semiconductor layer 206. In some embodiments, the positions of the first via holes H1 and the third via holes H3 are exchanged, such that each of the third via holes H3 is surrounded by four of the first via holes H1.

Figure 3B:
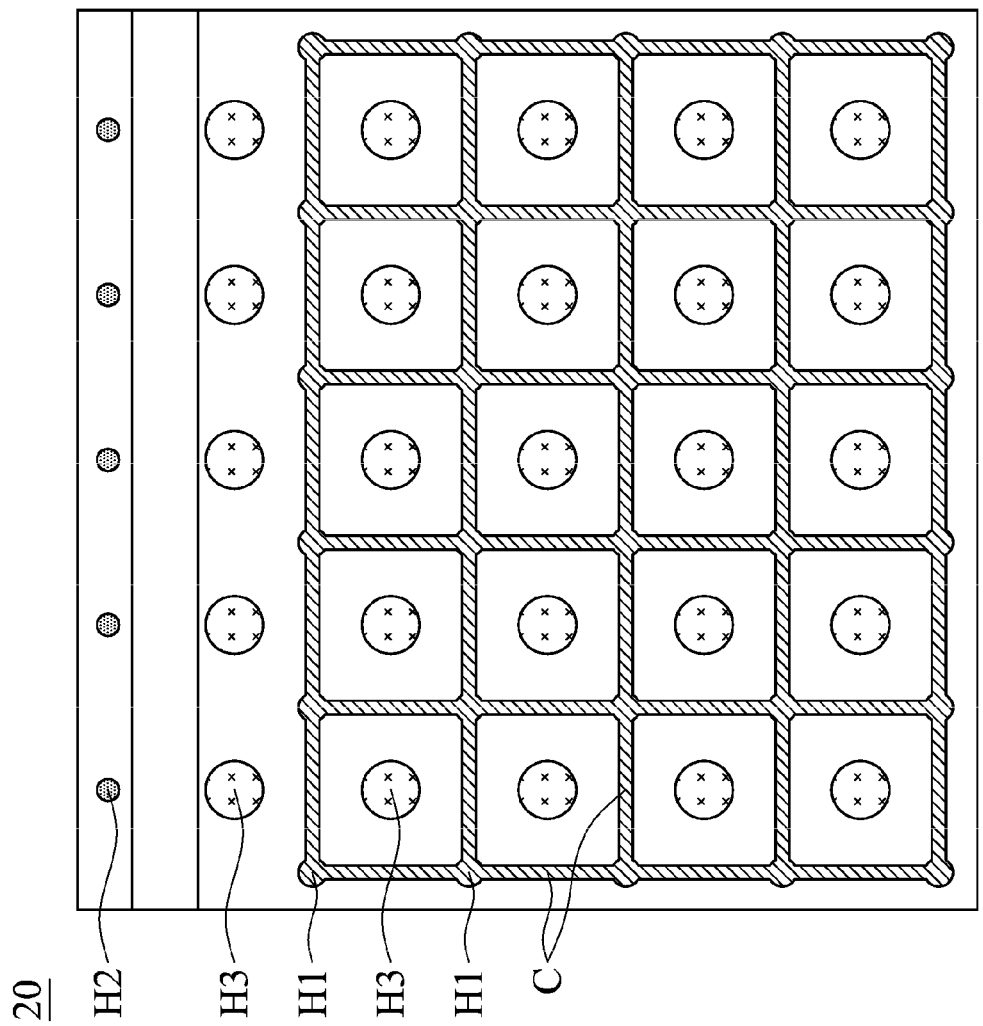
FIG. 3B is a schematic diagram shows the electrical contact configuration of an LED according to another embodiment of the invention.

Referring to FIG. 3B (top view), which shows an LED 20 according to another embodiment of the invention. The difference between FIG. 3B and FIG. 3A is that the adjacent first via holes H1 in FIG. 3B are connected through a trench C. It should be understood that the trenches C are formed in the Bragg reflector structure 400, as well as the first via holes H1, to expose the transparent conductive layer 300, such that the trenches C can be filled with the metal layer 500 to connect the first via holes H1. Additionally, in the embodiment of FIG. 3A, the adjacent first via holes H1 can also be connected through the trenches C. Alternatively, the third via holes H3 can be connected to each other through trenches C, and each of the independent first via holes H1 can be surrounded by the third via holes H3 and the trenches C.

As mentioned above, the invention provides an LED utilizing a transparent conductive layer comprising ITO and a Bragg reflector structure to replace the conventional reflecting ohmic contact layer, thereby achieving easy and efficient fabrication and improving the illumination efficiency of the LED. Moreover, since the LED of the invention also includes a metal layer which can achieve uniform current distribution in the LED, such that the illumination efficiency of the LED can be further enhanced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

What is claimed is:

1. A light-emitting diode (LED), comprising:
   a first semiconductor layer, defining a plurality of light-emitting regions and non-light-emitting regions;
   an active layer;
   a second semiconductor layer, wherein the active layer and the second semiconductor layer are sequentially formed over the first semiconductor layer in the light-emitting regions, and a plurality of light-emitting diode (LED) stack structures are formed by the first semiconductor layer in the light-emitting regions, the active layer, and the second semiconductor layer;
   a transparent conductive layer, formed over the second semiconductor layer of the LED stack structures;
   a Bragg reflector structure, formed over the transparent conductive layer and including a plurality of first via holes exposing the transparent conductive layer over the LED stack structures;
   a metal layer, formed over the Bragg reflector structure and filling the first via holes, wherein the metal layer is connected to the transparent conductive layer over the LED stack structures through the first via holes;
   a passivation layer, covering the metal layer and including a plurality of second via holes exposing the metal layer over the LED stack structures;
   a plurality of third via holes, exposing the first semiconductor layer in the non-light-emitting regions;
   a plurality of first electrodes, filling the third via holes and connected to the first semiconductor layer; and
   a plurality of second electrodes, filling the second via holes and connected to the metal layer.

2. The LED as claimed in claim 1, wherein the height of the light-emitting regions exceeds that of the non-light-emitting regions.

3. The LED as claimed in claim 1, wherein the metal layer comprises Ag, Al, Rh, or a combination thereof.

4. The LED as claimed in claim 1, further comprising a substrate with the first semiconductor layer formed thereon.

5. The LED as claimed in any one of claim 1, further comprising a current blocking layer formed between the transparent conductive layer and the second semiconductor layer of the LED stack structures, underneath the first via holes.

6. The LED as claimed in claim 1, wherein the side-wall of the LED stack structures is covered by the Bragg reflector structure.

7. The LED as claimed in claim 6, wherein the Bragg reflector structure covering the side-wall of the LED stack structures is covered by the passivation layer.

8. The LED as claimed in claim 1, wherein the first semiconductor layer is a N-type III-V semiconductor layer, and the second semiconductor layer is a P-type III-V semiconductor layer.

9. The LED as claimed in claim 8, wherein the III-V semiconductor layer comprises a nitride having Ga.

10. The LED as claimed in claim 9, wherein the nitride comprises GaN, InGaN, or AlInGaN.

11. The LED as claimed in claim 1, wherein the first via holes and the third via holes are arranged in matrices.

12. The LED as claimed in claim 11, wherein each of the first via holes is surrounded by four of the third via holes.

13. The LED as claimed in claim 12, wherein the Bragg reflector structure further includes a plurality of trenches exposing the transparent conductive layer and filled with the metal layer, wherein each of the trenches is situated between two of the adjacent first via holes for connecting those.

14. The LED as claimed in claim 11, wherein each of the third via holes is surrounded by four of the first via holes.

15. The LED as claimed in claim 14, wherein the Bragg reflector structure further includes a plurality of trenches exposing the transparent conductive layer and filled with the metal layer, wherein each of the trenches is situated between two of the adjacent third via holes for connecting those.

\* \* \* \* \*